United States Patent
Hendrickson

(10) Patent No.: US 7,498,850 B2
(45) Date of Patent: Mar. 3, 2009

(54) COMPENSATED COMPARATOR FOR USE IN LOWER VOLTAGE, HIGHER SPEED NON-VOLATILE MEMORY

(75) Inventor: Nicholas Hendrickson, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 60 days.

(21) Appl. No.: 11/767,227

(22) Filed: Jun. 22, 2007

(65) Prior Publication Data

US 2008/0315922 A1    Dec. 25, 2008

(51) Int. Cl.
*H03K 5/22* (2006.01)
(52) U.S. Cl. .............................. 327/63; 327/307; 327/65
(58) Field of Classification Search ........................ None
See application file for complete search history.

(56) References Cited

U.S. PATENT DOCUMENTS

| 4,485,317 | A | * | 11/1984 | Davies, Jr. | 326/71 |
| 4,697,108 | A | * | 9/1987 | Chappell et al. | 326/72 |
| 5,539,339 | A | * | 7/1996 | Van Rens | 327/51 |
| 5,614,853 | A | * | 3/1997 | Van Rens | 327/77 |
| 5,714,894 | A | * | 2/1998 | Redman-White et al. | 327/94 |

* cited by examiner

*Primary Examiner*—Tuan T Lam
*Assistant Examiner*—Hiep Nguyen
(74) *Attorney, Agent, or Firm*—Cool Patent, P.C.

(57) ABSTRACT

Briefly, in accordance with one or more embodiments, an offset compensated comparator is capable of being utilized for higher speed, lower voltage use. The comparator comprises a cross-coupled latch comprising n type devices and p type devices. The threshold mismatch between n type devices is captured on capacitors coupled to the gates of the n type devices to capture the mismatch between the devices. After the threshold mismatch is captured, the comparator can be used as a typical cross coupled latch.

12 Claims, 3 Drawing Sheets

COMPENSATED COMPARATOR FOR USE IN LOWER VOLTAGE, HIGHER SPEED NON-VOLATILE MEMORY

BACKGROUND

In comparator type circuits for non-volatile memories or the like, nulling of mismatch between devices is typically lost or destroyed during comparison phases. This impacts the performance of the comparator and reduces the ability of the comparator to sense data accurately and reliably.

DESCRIPTION OF THE DRAWING FIGURES

Claimed subject matter is particularly pointed out and distinctly claimed in the concluding portion of the specification. However, such subject matter may be understood by reference to the following detailed description when read with the accompanying drawings in which:

Figure 1:
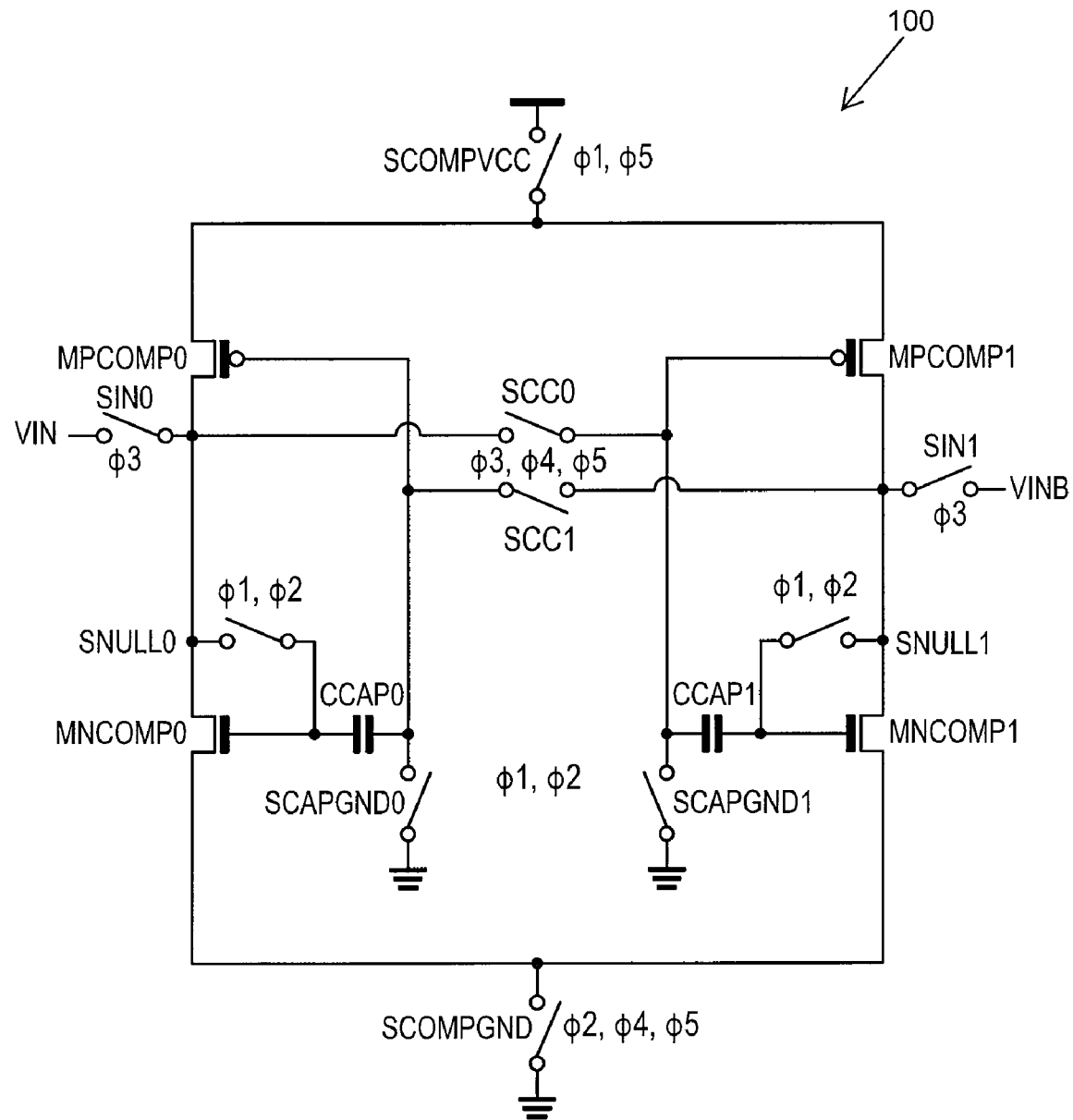
FIG. 1 is a diagram of a comparator circuit in accordance with one or more embodiments.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

In the following detailed description, numerous specific details are set forth to provide a thorough understanding of claimed subject matter. However, it will be understood by those skilled in the art that claimed subject matter may be practiced without these specific details. In other instances, well-known methods, procedures, components and/or circuits have not been described in detail.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. However, "over" may also mean that two or more elements are not in direct contact with each other. For example, "over" may mean that one element is above another element but not contact each other and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect. In the following description and/or claims, the terms "comprise" and "include," along with their derivatives, may be used and are intended as synonyms for each other.

Referring now to FIG. 1, a diagram of a comparator circuit in accordance with one or more embodiments will be discussed. As shown in FIG. 1, comparator 100 comprises an offset compensated comparator capable of being utilized for higher speed, lower voltage use, for example where VCC is approximately 1.65 V in one or more embodiments. As illustrated in FIG. 1, comparator 100 comprises a cross-coupled latch formed from devices MPCOMP0, MNCOMP0, MPCOMP1, and MNCOMP1. The threshold mismatch between device MNCOMP0 and device MNCOMP1 is captured on capacitors CCAP0 and CCAP1, respectively, through switches SNULL0 and SNULL1. After the threshold mismatch is captured, switches SNULL0 and SNULL1 are turned off and the device can be used as a typical cross coupled latch. Switches SCC0, SCC1, SCAPGND0, and SCAPGND1 allow for the proper connectivity of the devices before, during, and after the nulling phase.

The sequence of operation or comparator 100 is as follows. In one or more embodiments, phase 1 and phase 2 are nulling phases. During phase 1 ($\square$1), switch SCOMPVCC is closed and charges the internal nodes to VCC. Switch SCAPGND0 and switch SCAPGND1 are closed as well, which grounds the gates of device MPCOMP0 and device MPCOMP1 allowing them to pass the rail voltage VCC. Switch SNULL0 and switch SNULL1 are also closed which charges the internal storage node up. This node only needs to go several hundred millivolts above ground, so a simple NMOS pass gate can be used for switch SNULL0 and/or switch SNULL1. During phase 2 ($\square$2), switch SCOMPVCC is turned off and switch SCOMPGND is turned on. This causes the internal nodes to discharge through device MNCOMP0 and device MNCOMP1. These devices begin to turn off in the process and a voltage difference between the two gates of device MNCOMP0 and device MNCOMP1 develops nearly equal to their threshold mismatch.

In one or more embodiments, phase 3, phase 4, and phase 5 are comparator phases. During phase 3 (L3), switch SNULL0 and switch SNULL1 are turned off, trapping the built voltage differential on the gates of the MNCOMP devices. Switch SCC0 and switch SCC1 are turned on to to close the cross-coupling. At this point comparator 100 operates as a standard cross-coupled latch. Switch SIN0 and switch SIN1 are closed to pass in two voltages to be compared, for example voltage VIN and voltage VINB. Switch SCOMPVCC and switch SCOMPGND are both open so as to avoid burning any current. During phase 4 ($\square$4), switch SIN0 and switch SIN1 are opened to trap the voltages being compared. Switch SCOMPGND is opened to begin the comparison. By sequencing the power supplies in this way some gain is realized using just the MNCOMP devices which have had their mismatch compensated for. Lastly, during phase 5 ($\square$5) SCOMPVCC is closed and the comparator latches one side to VCC and the other to ground.

Compared to an uncompensated comparator, such an arrangement of comparator 100 results a lower impact from device mismatch. Compared to other compensated comparator design, comparator 100 may utilize a wide variety of input bias voltages. If the input signal is very low, near ground, arrangement of comparator 100 could be turned upside down and the compensation applied to the device MPCOMP0 and device MPCOMP1 with the sequencing reversed. In one or more embodiments, comparator 100 may be used for several sequential senses before executing through phase 1 (Φ1) and phase 2 (Φ2) again. In higher speed designs, such an arrangement may achieve significant time savings. In one or more embodiments, once the offset is nulled, the input voltages are independent of the offset voltages just trapped, which may be suitable for current sensing schemes as utilized in non-volatile memories such as flash, ovonic unified memory (OUM), phase change memory, and so on. Lastly, such an arrangement of comparator 100 may achieve relatively immune from noise on the rail voltage VCC, although the scope of the claimed subject matter is not limited in these respects.

Figure 2:
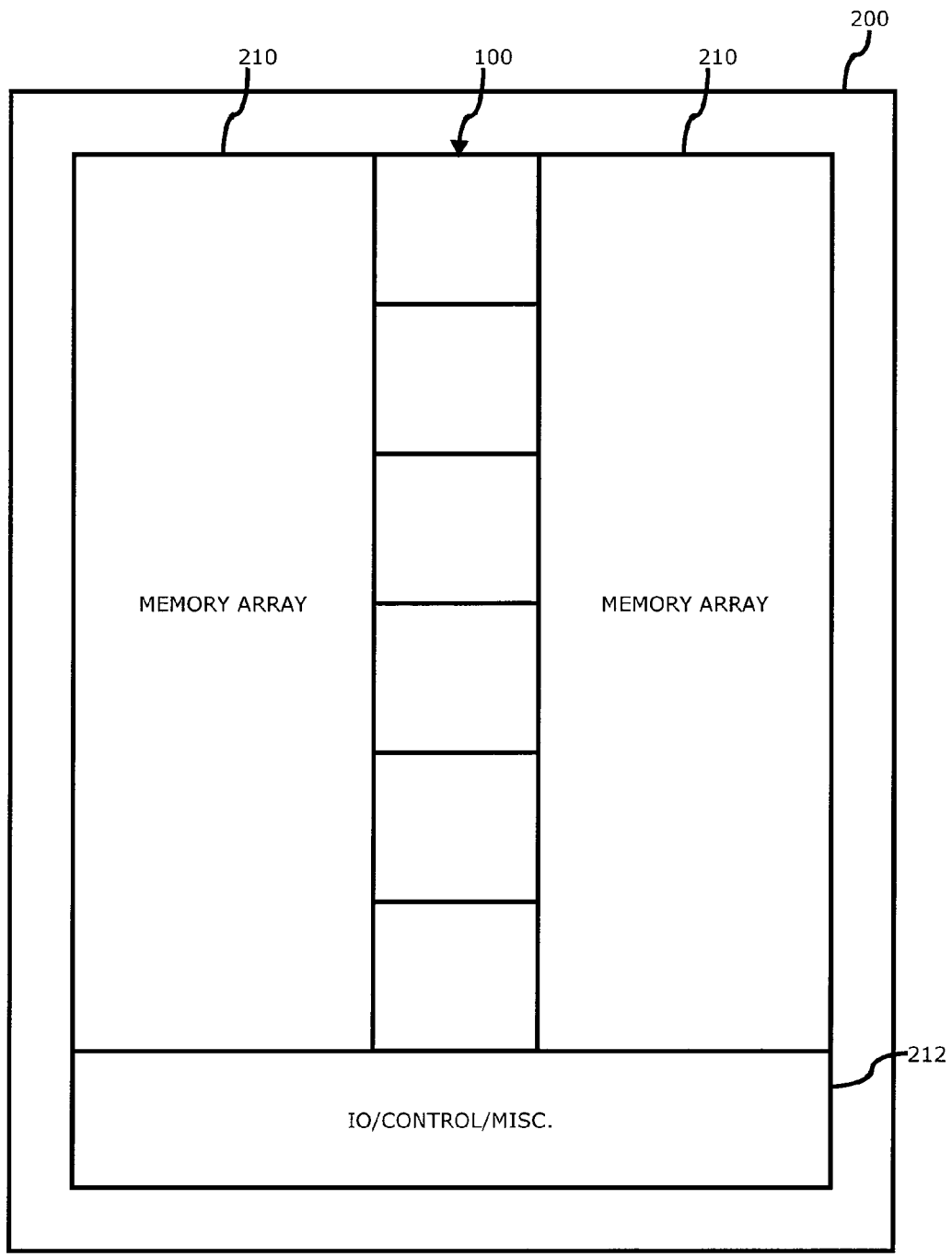
FIG. 2 is a block diagram of a flash memory system capable of utilizing the comparator circuit of FIG. 1 in accordance with one or more embodiments.

Referring now to FIG. 2, a block diagram of a flash memory system capable of utilizing the comparator circuit of FIG. 1 in accordance with one or more embodiments will be discussed. Flash memory system 200 is one example of a non-volatile memory device or system capable of utilizing comparator 100 of FIG. 1. In one or more embodiments, flash memory system 200 may comprise a flash memory integrated circuit or chip having one or more memory arrays 210 disposed on the chip and being coupled to one or more comparators 100 as shown in and described with respect to FIG. 1 for sensing data stored in the one or more memory arrays 210. Flash memory system may also comprise an input/output (IO)/Control/Miscellaneous circuit block 212 coupled to the one or more comparators 100, for example to perform and control read and/or write operations from and/or to memory arrays 210. It should be noted that although FIG. 2 depicts an example flash memory system 200, comparators 100 may be utilized in other types of memory systems, devices, and or integrated circuits such as non-volatile memory type devices such as phase change memory, ovonic unified memory (OUM), phase change memory, and the scope of the claimed subject matter is not limited in this respect.

Figure 3:
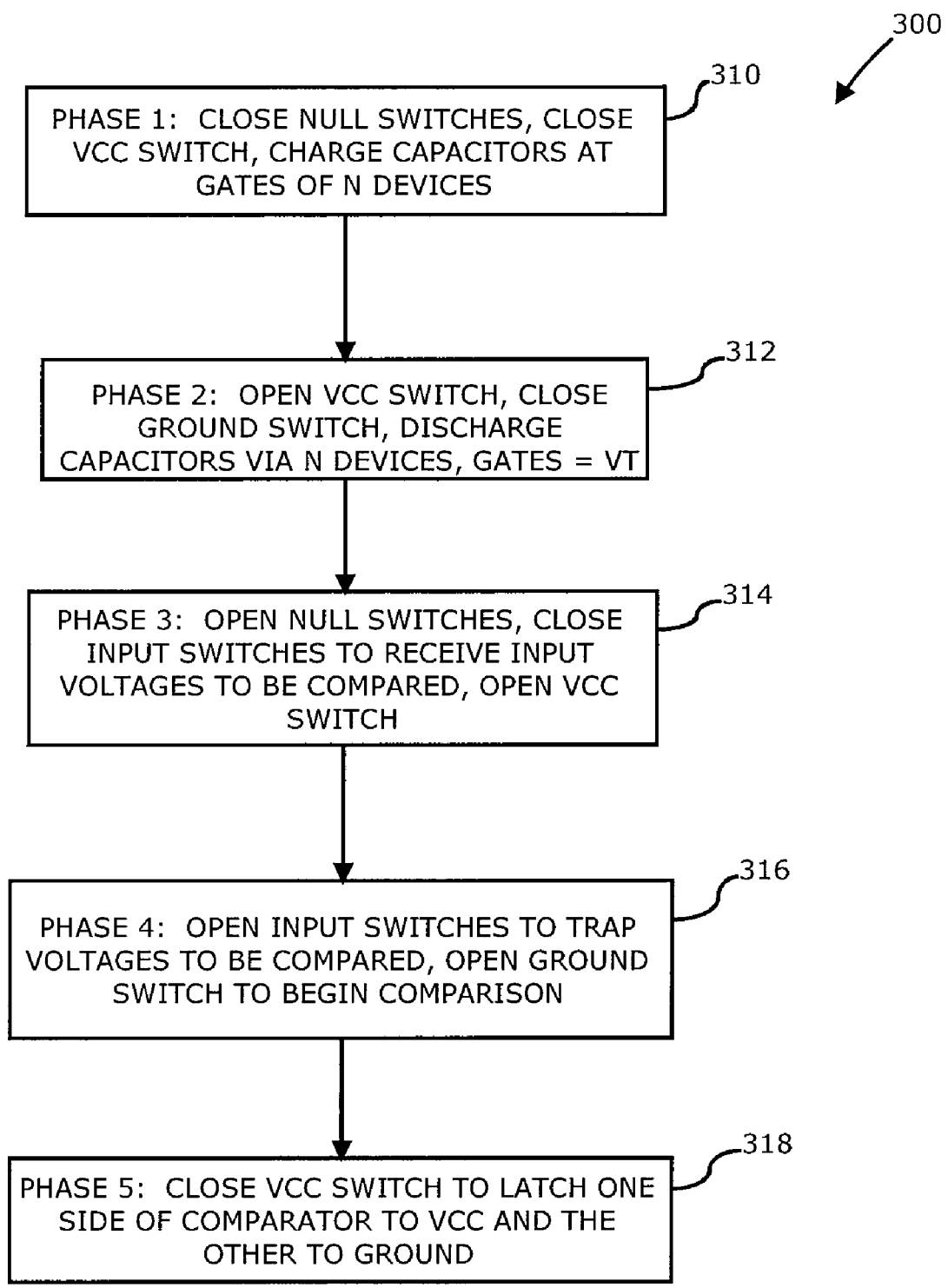
FIG. 3 is a flow diagram of a method of operation of a comparator circuit in accordance with one or more embodiments.

Referring now to FIG. 3, a flow diagram of a method of operation of a comparator circuit in accordance with one or more embodiments will be discussed. Method 300 of FIG. 3 may include more or fewer blocks than shown, and furthermore the order of the blocks is not limited to the particular order shown in FIG. 3. During phase 1 at block 310, the null switches SNULL0, SNULL1, SCAPGND0 and SCAPGND1 may be closed and the rail voltage switch SCOMPVCC may be closed to charge the capacitors CCAP0 and CCAP1 coupled to the gates of devices MNCOMP0 and MNCOMP1. During phase 2 at block 312, the rail voltage switch SCOMPVCC may be opened and the ground switch SCOMPGND may be closed to discharge capacitors CCAP0 and CCAP1 via devices MNCOMP0 and MNCOMP1 so that the voltage at the gates of devices MNCOMP0 and MNCOMP1 is at or near the threshold voltage mismatch of devices MNCOMP0 and MNCOMP1 so that the threshold voltage mismatch may be reduced or canceled. During phase 3 at block 314, the null switches are open, and input switches SIN0 and SIN1 are closed to receive the input voltages to be compared. The rail voltage switch SCOMPVCC may be opened for example to reduce current consumptions of comparator circuit 100. During phase 4 at block 316, input switches SIN0 and SIN1 are opened to trap the voltages to be compared, and ground switch SCOMPGND may be opened to begin the comparison of the input voltages. During phase 5, the rail voltage switch SCOMPVCC may be closed to latch one side of comparator circuit 100 to the rail voltage and the other to ground.

Although the claimed subject matter has been described with a certain degree of particularity, it should be recognized that elements thereof may be altered by persons skilled in the art without departing from the spirit and/or scope of claimed subject matter. It is believed that the subject matter pertaining to a compensated comparator for use in lower voltage, higher speed non-volatile memory and/or many of its attendant utilities will be understood by the forgoing description, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:

1. A method, comprising:
   during a nulling phase, charging coupling capacitors coupled at respective gates of a first pair of devices at a cross coupled latch, and discharging the coupling capacitors to reduce or cancel a mismatch between the first pair of devices to achieve nulling; and
   during a comparison phase, comparing input voltages provided to a second pair of devices and the coupling capacitors of the cross coupled latch to provide a comparator output.

2. A method as claimed in claim 1, wherein the nulling achieved during the nulling phase is preserved during the comparison phase.

3. A method as claimed in claim 1, wherein said nulling phase comprises closing null switches, and closing a rail voltage switch during a first phase.

4. A method as claimed in claim 1, wherein said nulling phase comprises opening the rail switch and closing a grounding switch during a second phase.

5. A method as claimed in claim 1, wherein said comparing phase comprises opening nulling switches to preserve the voltage offset while allowing input voltages to be compared.

6. A method as claimed in claim 1, wherein the mismatch to be reduced or canceled comprises a mismatch in threshold voltage of the first pair of devices.

7. A method as claimed in claim 1, wherein said comparator adds gain to the input signal before using an uncompensated second pair of devices.

8. An apparatus, comprising:
   a first pair of devices having a capacitor coupled to respective gates of the first pair of devices to create an internal node;
   a set of switches to allow charging and discharging of the internal node between the capacitors and the first pair of devices to reduce or cancel mismatch of the first pair of devices;
   a second set of switches to ground another side of the capacitors during a nulling phase; and
   a third set of switches to turn off the cross-coupling during a nulling phase;
   wherein the mismatch reduced or canceled is preserved during a comparison of the input voltages by the first pair of devices and the second pair of devices to provide a compensated comparator output.

9. An apparatus as claimed in claim 8, said first pair of devices comprising n type transistors, and the second pair of devices comprising p type transistors.

10. An apparatus as claimed in claim 8, said first pair of devices comprising p type devices, and the second pair of devices comprising n type transistors.

11. An apparatus as claimed in claim 8, at least one or more of the set of switches comprising an n type metal oxide semiconductor pass gate.

12. An apparatus as claimed in claim 8, at least one or more of the set of switches comprising a p type metal oxide semiconductor pass gate.

* * * * *